United States Patent
Bui et al.

(10) Patent No.: US 11,393,773 B1
(45) Date of Patent: Jul. 19, 2022

(54) STRESS ISOLATING INTERPOSER AND SENSOR PACKAGE AND METHOD OF MANUFACTURING THE SAME

(71) Applicant: HRL LABORATORIES, LLC, Malibu, CA (US)

(72) Inventors: Phuong Bui, Thousand Oaks, CA (US); Matthew J. Pelliccione, Malibu, CA (US); Kayleigh A. Porter, Malibu, CA (US); Tobias A. Schaedler, Oak Park, CA (US); Logan D. Sorenson, Thousand Oaks, CA (US); Raviv Perahia, Agoura Hills, CA (US)

(73) Assignee: HRL LABORATORIES, LLC, Malibu, CA (US)

( * ) Notice: Subject to any disclaimer, the term of this patent is extended or adjusted under 35 U.S.C. 154(b) by 172 days.

(21) Appl. No.: 16/875,727

(22) Filed: May 15, 2020

Related U.S. Application Data

(63) Continuation-in-part of application No. 16/153,601, filed on Oct. 5, 2018, now Pat. No. 10,696,546.

(60) Provisional application No. 62/875,373, filed on Jul. 17, 2019, provisional application No. 62/596,463, filed on Dec. 8, 2017.

(51) Int. Cl.
*H01L 23/00* (2006.01)
*H01L 23/16* (2006.01)

(52) U.S. Cl.
CPC ............ *H01L 23/562* (2013.01); *H01L 23/16* (2013.01)

(58) Field of Classification Search
CPC .............................. H01L 23/562; H01L 23/16
See application file for complete search history.

(56) References Cited

U.S. PATENT DOCUMENTS

| | | | |
|---|---|---|---|
| 8,698,292 B2 | 4/2014 | Najafi et al. | |
| 10,167,189 B2 | 1/2019 | Zhang et al. | |
| 10,221,284 B2 | 3/2019 | Eckel | |
| 10,232,583 B2 | 3/2019 | Clough et al. | |
| 10,288,359 B2 | 5/2019 | Jacobsen et al. | |
| 10,590,042 B2 | 3/2020 | Eckel et al. | |
| 2010/0251818 A1* | 10/2010 | Ge | G01C 19/5684 73/504.12 |
| 2016/0090297 A1* | 3/2016 | Zhang | B81B 7/0048 257/417 |
| 2017/0362414 A1 | 12/2017 | Pasini et al. | |
| 2018/0148379 A1 | 5/2018 | Schaedler et al. | |

OTHER PUBLICATIONS

Aspar, G., "3D printing as a new packaging approach for MEMS and Electronic devices," IEEE 67TH Electronic Components and Technology Conference, 2017, 9 pages.

(Continued)

*Primary Examiner* — Karen Kusumakar
*Assistant Examiner* — Adam S Bowen
(74) *Attorney, Agent, or Firm* — Lewis Roca Rothgerber Christie LLP

(57) ABSTRACT

A stress isolating interposer includes: an outer pad; an inner pad configured to accommodate a positional sensor is mounted; and a stress isolating structure coupling the outer pad and the inner pad to each other. The outer pad, the stress isolating structure, and the inner pad are a monolithic structure.

24 Claims, 11 Drawing Sheets
(3 of 11 Drawing Sheet(s) Filed in Color)

(56) References Cited

OTHER PUBLICATIONS

Chen, Y., et al., "A novel three-dimensional auxetic lattice metamaterial with enhanced stiffness," Smart Materials and Structures, 26 (2017) 12 pages.

Ju, J. et al., "Design of Honeycombs for Modulus and Yield Strain in Shear," Journal of Engineering Materials and Technology, Jan. 2012, vol. 134, 15 pages.

Lee., S.H., et al., "A Generic Environment-Resistant Packaging Technology for Mems," IEEE, 2007, 4 pages.

Lim, T.-C., "Auxetic Materials and Structures," Series: Engineering Materials Hardcover, Publisher: Springer; 2015 edition (Dec. 28, 2014), 587 pages.

Maconachie, T., et al., "SLM lattice structures: Properties, performance, applications and challenges," Materials and Design, 183, (2019) 108137, 18 pages.

McCaw, J., "3D Auxetic Lattices", Oct. 13, 2018, https://jcmccaw.com/2018/10/13/3d-auxetic-lattices, 3 pages.

Muslija, A., et al., "Deep reactive ion etching of auxetic structures: present capabilities and challenges," Smart Materials and Structures, 23 (2014) 8 pages.

Pending U.S. Appl. No. 15/822,199, filed Nov. 26, 2017, entitled Monomer Formulations and Methods for 3D Printing of Preceramic Polymers.

Pending U.S. Appl. No. 15/822,203, filed Nov. 26, 2017, entitled Formulations with Active Functional Additives for 3D Printing of Preceramic Polymers, and Methods of 3D-Printing the Formulations.

Pending U.S. Appl. No. 16/029,525, filed Jul. 6, 2018, entitled Formulations for 3D Printing of Isocyanate-Modified Polysilazanes or Polycarbosilanes.

Pending U.S. Appl. No. 16/029,526, filed Jul. 6, 2018, entitled Formulations for 3D Printing of Hydrosilylation-Modified Polysilazanes.

Pending U.S. Appl. No. 16/029,527, filed Jul. 6, 2018, entitled Formulations for 3D Printing of Isothiocyanate-Modified Polysilazanes or Polycarbosilanes.

Pending U.S. Appl. No. 15/060,488, filed Mar. 3, 2016, entitled Cellular Ceramic Materials.

Pending U.S. Appl. No. 15/190,486, filed Jun. 23, 2016, entitled Ordered Cellular Structures and Methods of Manufacturing the Same.

Pending U.S. Appl. No. 14/964,273, filed Dec. 9, 2015, entitled Net Shape Ceramic Microtruss and Ceramic Microtruss with Metal Shell.

\* cited by examiner

STRESS ISOLATING INTERPOSER AND SENSOR PACKAGE AND METHOD OF MANUFACTURING THE SAME

CROSS-REFERENCE TO RELATED APPLICATION

The present application is a continuation-in-part of U.S. application Ser. No. 16/153,601, filed on Oct. 5, 2018, which claims priority to and the benefit of U.S. Provisional Patent Application Ser. No. 62/596,463, filed on Dec. 8, 2017, and claims priority to and the benefit of U.S. Provisional Patent Application Ser. No. 62/875,373, filed on Jul. 17, 2019, the content of each of which is incorporated herein by reference.

BACKGROUND

1. Field

One or more aspects of embodiments of the present invention relate to a stress isolating interposer and a sensor package including the interposer and a method of manufacturing the interposer and the sensor package.

2. Related Art

There is an increasing demand for devices that can quickly and accurately determine their position, speed, direction, etc. and, by association, the position, speed, direction, etc. of any vehicle, object, device, etc. to which the device is attached. Commonly, accelerometers, gyroscopes, magnetometers, and inertial measurement units (IMUs), which are a combination of accelerometers, gyroscopes, and/or magnetometers, (collectively, "positional sensors") have been used to determine a vehicle's acceleration, motion, and/or position.

Recently, the use of microelectromechanical systems (MEMS) in positional sensors has increased, particularly in high-precision implementations, such as in the defense industry. MEMS devices are a classification of microscopic devices, such as those with moving parts. MEMS devices generally include components having a size in a range of about 1 µm to about 100 µm but are not limited thereto. Generally, MEMS devices have an overall dimension in a range of about 20 µm to about 1 mm, but MEMS devices may have any suitable size as would be understood by those skilled in the art.

Based on the operating environment, positional sensors may be subjected to widely variant thermal environments and relatively strong vibrations. For example, positional sensors may be used on spacecraft, space exploration vehicles, airplanes, submarines, automobiles, etc.

Positional sensors are generally housed in sensor packages (also referred to as "packages"), which are then mounted to a vehicle or the like. The sensor package may provide electrical connection to the vehicle for the transmission of power and/or signals. But positional sensors may be subjected to thermal and mechanical stress due to different thermal expansion coefficients of the components of the positional sensor, the sensor packaging, and the sensor mounting structures and configuration and external vibrations. Such stress may degrade the positional sensor's performance, negatively impacting the output (e.g., the accuracy) of the positional sensor, potentially causing error creep.

For example, related art sensor packages are generally formed of aluminum oxide (e.g., $Al_2O_3$), which has a coefficient of thermal expansion (CTE) of about 8, and positional sensors are generally formed of silicon (Si), which has a CTE of about 2.6. Due, at least in part, to this relatively large difference in CTE between the sensor package and the positional sensor, relatively large thermal stresses may be applied to the positional sensor during ovenization (e.g., heating) or in extreme temperature conditions. As such, structures for isolating the positional sensor from thermal and mechanical stresses, such as the embodiments of the present invention described below, are desired.

SUMMARY

Aspects of embodiments of the present invention are directed toward a stress (e.g., thermal and mechanical stress) isolating interposer, a sensor package including the interposer, and a method of manufacturing the interposer and the sensor package. The interposer may provide thermal and mechanical insulation from the surrounding environment, thereby preventing or at least reducing error creep in a positional sensor mounted on the interposer in the sensor package. In some embodiments, the interposer may include an inner pad (e.g., a center stage) on which a positional sensor is arranged, an outer pad, and a stress isolating structure between the inner and outer pads. In some embodiments, the outer pad, the stress isolating structure, and the inner pad may be a monolithic structure. In some embodiments, the stress isolating structure may be an auxetic structure. In some embodiments, the sensor package may include a vacuum structure (e.g., a double-wall vacuum jacket) to improve thermal insulation. In some embodiments, the sensor package may be formed as an integral structure including the interposer (e.g., the sensor package may be integrally formed with the interposer), but in other embodiments, the interposer and the sensor package may be formed separately and joined with each other. In some embodiments, the sensor package and/or the interposer may be manufactured by using a three-dimensional (3D) printing process. Due to difficulties in 3D printing long distances (or long lengths) of down-facing, over-hanging structures, supports may be added to the sensor package to support different portions of the interposer. The supports may be, as some examples, a lattice, gusset, or post, which may be accurately and repeatably manufactured by using a 3D printing process. By strategic placement of the supports, the inner pad (e.g., the center stage), on which the positional sensor is mounted, may remain thermally and mechanically isolated from the surrounding interposer structure and sensor package while still allowing for the sensor package and/or the interposer to be manufactured by using a 3D printing process.

According to one embodiment, a stress isolating interposer includes: an outer pad; an inner pad configured to accommodate a positional sensor is mounted; and a stress isolating structure coupling the outer pad and the inner pad to each other. The outer pad, the stress isolating structure, and the inner pad are a monolithic structure.

The outer pad may surround a periphery of the inner pad.

The stress isolating structure may include a plurality of separate stress isolating structures extending between the outer pad and the inner pad.

The stress isolating structure may include one or more of an auxetic structure, a lattice, and a spring-mass damper structure.

According to another embodiment, a stress isolating sensor package for a microelectromechanical sensor is provided. The stress isolating sensor package includes: a jacket having a vacuum space therein; and an interposer coupled to the jacket. The jacket extends around and under the microelectromechanical sensor and includes electrical feedthroughs. The interposer includes: an outer pad coupled to the jacket; an inner pad on which the microelectromechanical sensor is mounted; and a stress isolating structure coupling the outer pad and the inner pad to each other. The outer pad, the stress isolating structure, and the inner pad are a monolithic structure.

The stress isolating sensor package may further include a plurality of supports under the interposer and extending between the jacket and the outer pad of the interposer.

The inner pad and the stress isolating structure may be suspended above the jacket without any supports extending there between.

The supports may include a first group of supports and a second group of supports. The second group of supports may be arranged between the first group of supports and the inner pad. A width or diameter of each of the supports of the second group of supports may be smaller than a width or diameter of each of the supports of the first group of supports.

The stress isolating sensor package may further include a plurality of additional supports under the stress isolating structure and extending between the jacket and the stress isolating structure.

The stress isolating structure may include one or more of an auxetic structure including a plurality of unit cells, a lattice, and/or a spring-mass damper structure.

The jacket and the interposer may be a monolithic structure.

The interposer may further include electrical traces.

The stress isolating sensor package may further include a heater and a thermal probe on the inner pad.

The stress isolating sensor package may further include a support structure within the vacuum space in the jacket.

The support structure in the jacket may include one or more of a lattice structure, a truss structure, a three-dimensional re-entrant structure, and a gusset structure.

The stress isolating sensor package may further include a reflective coating on the jacket.

According to another embodiment, a method of additively manufacturing a stress isolating sensor package is provided. The method includes: selectively irradiating a light onto a layer of pre-ceramic resin in a two-dimensional pattern to cure the pre-ceramic resin layer-by-layer into a green-state sensor package. The green-state sensor package includes a green-state interposer, and the green-state interposer includes: an inner pad; a stress isolating structure around the inner pad; and an outer pad around the stress isolating structure.

The green-state sensor package may further include: a green-state hollow double-walled jacket around the green-state interposer; and a plurality of supports within the hollow double-walled jacket.

The green-state sensor package may further include a plurality of supports connecting the outer pad of the green-state interposer and the green-state hollow double-walled jacket.

The light may have a wavelength in a range of 200 nm to 500 nm.

The method of may further include heat treating the green-state sensor package to form a ceramic package. The heat treating may occur at temperatures in a range from 150° C. to 1,800° C. in an atmosphere of air, argon, nitrogen, hydrogen, oxygen, ammonium, silanes, or a mixture thereof.

The method may further include: forming an opening in the green-state hollow double-walled jacket before the heat treating; pulling a vacuum from a space inside the hollow double-walled jacket after the heat treating; and sealing the opening in the hollow double-walled jacket to form a vacuum space in the hollow double-walled jacket.

The pre-ceramic resin may include ceramic particles.

The stress isolating structure may include one or more of an auxetic structure, an auxetic lattice structure, a lattice structure, and a spring-mass damper structure.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

These and other aspects and features of the present invention will be further appreciated and better understood with reference to the specification, claims, and appended drawings, in which:

DETAILED DESCRIPTION

The detailed description set forth below in connection with the appended drawings is intended as a description of example embodiments of the present invention and is not intended to represent the only forms in which the present invention may be embodied. The description sets forth aspects and features of the present invention in connection with the illustrated embodiments. It is to be understood, however, that the same or equivalent aspects and features may be accomplished by different embodiments, and such other embodiments are encompassed within the spirit and scope of the present invention. As noted elsewhere herein, like element numbers in the description and the drawings are intended to indicate like elements. Further, descriptions of features, configurations, and/or other aspects within each embodiment should typically be considered as available for other similar features, configurations, and/or aspects in other embodiments.

Figure 1A:
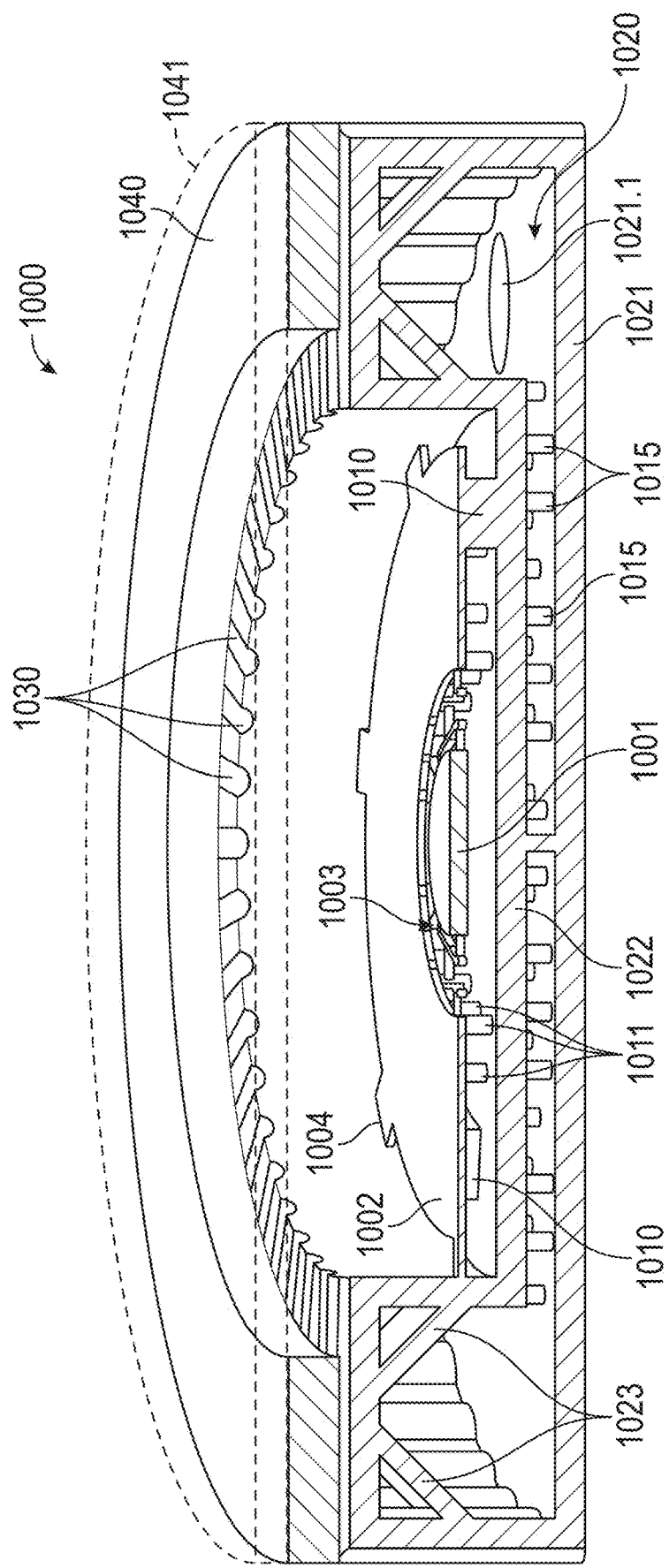
FIG. 1A is a cross-sectional view of a sensor package according to an embodiment of the present invention.
Figure 1B:
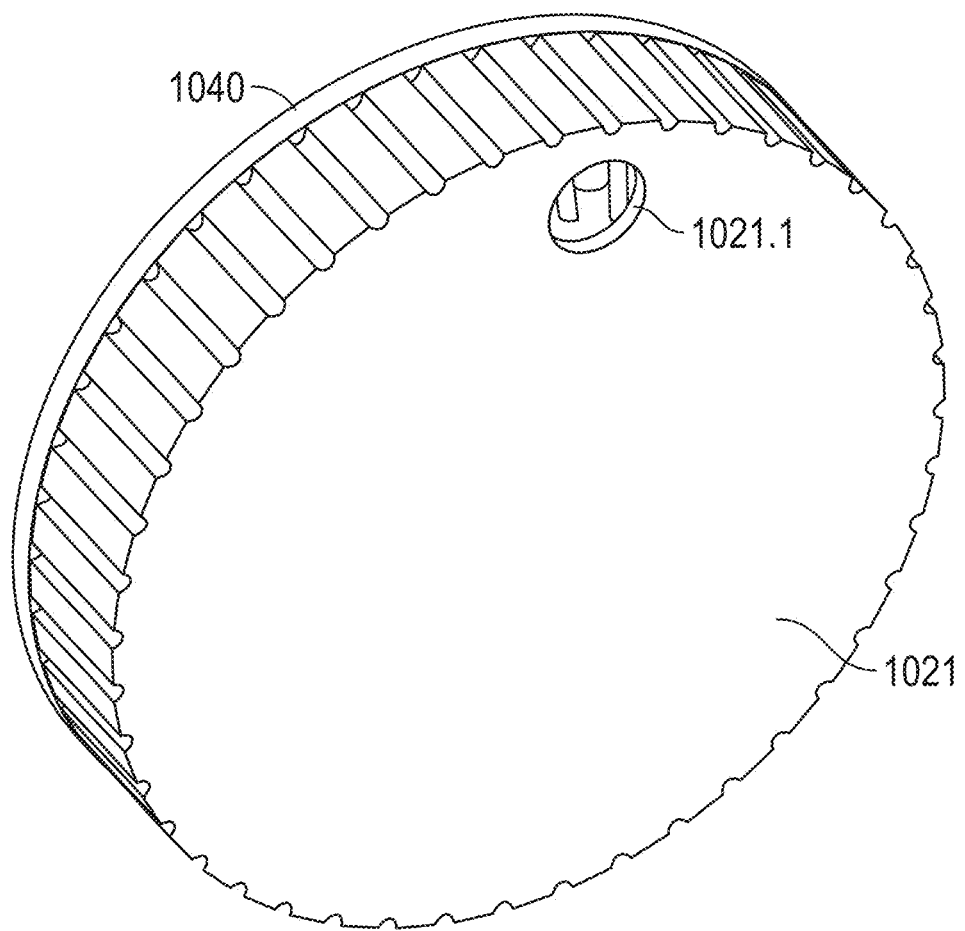
FIG. 1B is a perspective view of a bottom of the sensor package shown in FIG. 1A.

FIG. 1A is a cross-sectional view of a sensor package 1000 according to an embodiment of the present invention, and FIG. 1B is a perspective view of a bottom of the sensor package 1000. The sensor package 1000 includes an interposer, which is formed of (or includes) an inner pad 1001 on which a sensor (e.g., a positional sensor, such as an accelerometer, gyroscope, magnetometer, IMU, etc.) is attached (e.g., the inner pad 1001 is configured to receive a positional sensor), an outer pad 1002, and a stress isolating structure (e.g., a microscale stress isolating structure or relieving structure) 1003 connecting the inner pad 1001 and the outer pad 1002 to each other. As used herein, "microscale" refers to elements having a size in a range of about 10 µm to about 1,000 µm.

The sensor may be a microelectromechanical systems (MEMS) sensor, such that the sensor package 1000 may be considered a microelectromechanical sensor package 1000. MEMS devices are a classification of microscopic devices, such as those with moving parts. MEMS devices generally include components having a size in a range of about 1 µm to about 100 µm but are not limited thereto. Generally, MEMS devices have an overall dimension in a range of about 20 µm to about 1 mm, but MEMS devices may have any suitable size as would be understood by those skilled in the art.

In some embodiments, the stress isolating structure 1003 may be (or may include) an auxetic structure, such as an auxetic lattice, a lattice, and/or a spring-mass damper.

Auxetic structures, such as auxetic lattices, are metamaterial structures that have a negative, tailorable Poisson's ratio. By tailoring the Poisson's ratio of the auxetic structure, the sensor package 1000 may compensate for a difference in coefficient of thermal expansion (e.g., CTE) between the sensor package, the interposer, and the positional sensor such that the positional sensor can expand and/or contract without being compressed, pulled, and/or distorted (e.g., twisted) by the sensor package and/or the interposer.

In some embodiments, a lattice (e.g., a lattice structure) may be used as the stress isolating structure 1003. A lattice is an ordered, three-dimensional open-cellular structures that includes one or more repeating unit cells. The unit cells are defined by struts or surfaces extending in a three-dimensional space and interconnect with one another. Generally, a lattice's unit cell arrangement can be categorized as being either strut-based or triply periodic minimal surfaces (TPMS). The cellular structures can be varied or tailored, for example, in cell size, topology, strut dimensions, etc., to obtain desired properties, including acoustic, dielectric, and mechanical properties. Here, the lattice is optimized to withstand and isolate imposed stresses.

In some embodiments, a spring-mass damping system may be used as the stress isolating structure 1003. The spring-mass damping system may be formed by using the 3D printing method described in more detail below.

Poisson's ratio is the ratio of transverse contraction strain to longitudinal extension strain in a stretched material. Common materials and structures, such as rubber and hexagonal honeycomb lattices, have a positive Poisson's ratio, which means their cross section gets thinner when stretched. Auxetic materials have negative Poisson's ratio, which means that their cross section expands laterally when stretched. According to embodiments of the present invention, the Poisson's ratio of the stress isolating structure 1003 may vary (or may be varied) in a range from about −1 to about +0.5. In some embodiments, the Poisson's ratio may be between about −0.9 and about 0.4. In other embodiments, the Poisson's ratio may be between about −0.8 and about 0.3.

Structures having both positive and negative Poisson's ratios, depending on parameter design, may exhibit energy absorption and, thus, stress isolating properties. In some embodiments, a structure having a negative Poisson's ratio may be preferred as such structures undergo volume changes rather than shape changes and have improved shear resistance, indentation resistance, and fracture toughness.

Figure 6A:
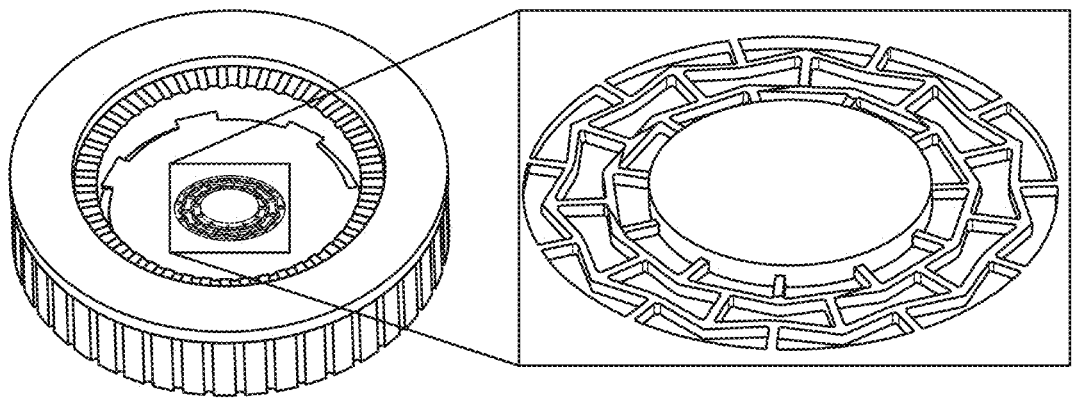
FIGS. 6A-6D show sensor packages having different stress isolating structures according to embodiments of the present invention.
Figure 6B:
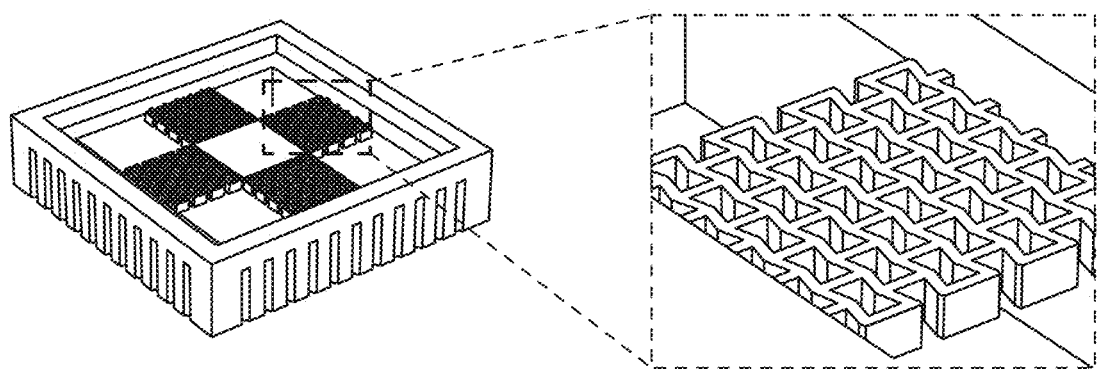
Figure 6C:
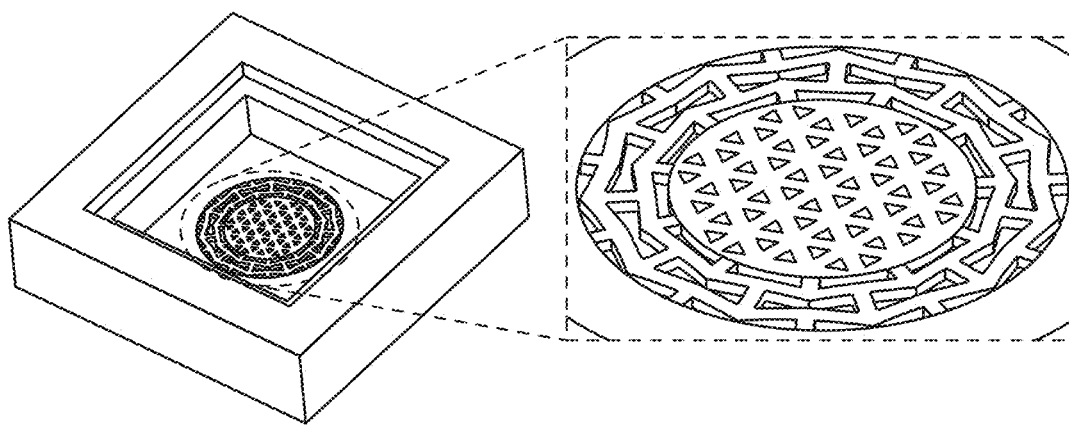
Figure 6D:
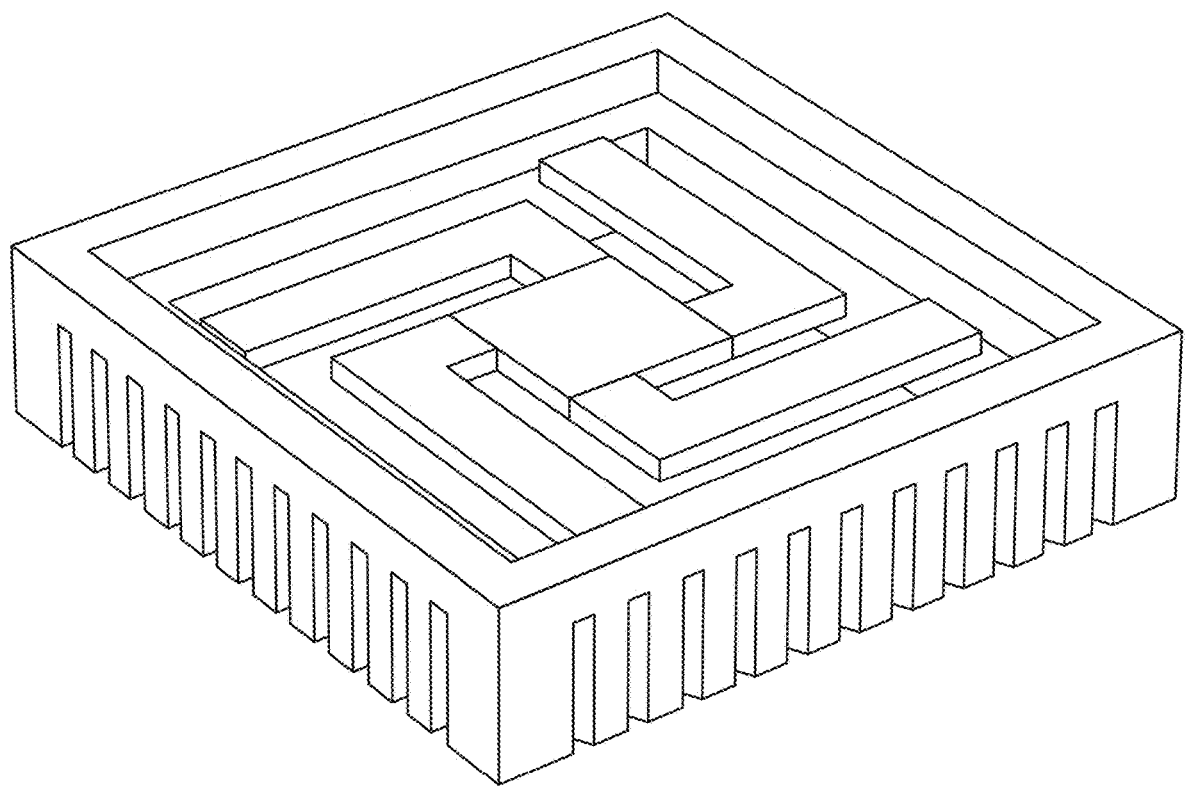

Example stress isolating structures are shown in FIGS. 6A-6D. FIG. 6A shows a circular auxetic structure as the stress isolating structure, similar to the stress isolating structure 1003 shown in FIGS. 1-2B, FIG. 6B shows a rectangular (or square) interposer with four auxetic structures as the stress isolating structure attaching an inner pad to a frame, FIG. 6C shows a circular auxetic structure as the stress isolating structure, similar to the stress isolating structure 1003 shown in FIGS. 1-2B, but with additional relief structures (e.g., patterns, holes, or openings) in the inner pad, and FIG. 6D shows a spring-mass damper stress isolating structure. The auxetic structures may be two-dimensional or three-dimensional. As described above, the present invention, however, is not limited to using an auxetic structure as the stress isolating structure 1003, and in other embodiments, the stress isolating structure 1003 may be (or may include or further include) one or more of cantilevered springs, lattices, honeycomb structures, and/or spring-mass dampers (see, e.g., FIG. 6D). In some embodiments, a plurality of unit cells may be arranged in a matrix of multiple concentric rings or, in other embodiments, in rows and columns.

Examples of suitable auxetic lattices are shown in FIGS. 9A-10F of U.S. application Ser. No. 16/153,601, the entire content of which is incorporated herein by reference. Other suitable examples are shown in U.S. Publication No. 2017/0362414, the entire content of which is incorporated herein by reference.

A suitable microtruss lattice is described in U.S. Pat. No. 10,232,583, the entire content of which is incorporated herein by reference.

The sensor package 1000 further includes a jacket 1021, which forms a sealed space that is placed under vacuum (e.g., a vacuum space 1020) to further thermally and mechanically isolate the positional sensor on the inner pad 1001 from the external environment. In some embodiments, the material of the jacket 1021 and the inner pad 1001 may be the same. The vacuum space 1020 may extend around (e.g., under and along) a periphery of the inner pad 1001 and the outer pad 1002. In some embodiments, a reflective coating may be applied to an inner surface facing the interposer and/or outer surface of the jacket 1021 exposed to the external environment to further improve thermal insulation. The inner surface of the jacket 1021 refers to the portion of the jacket 1021 facing toward the inner pad 1001. The reflective coating may provide at least 85% reflectance in the infrared wavelength band and may include (or may be formed of) gold, silver, platinum, aluminum, and/or another suitable reflective material. The reflective coating may have a thickness in a range of about 10 nm to about 1 mm.

Jacket supports 1015 and 1023 may be provided inside the vacuum space 1020 to increase the strength of the sensor package 1000 and to provide additional stress (e.g., thermal and vibration) isolating. In some embodiments, a lattice structure (e.g., columns, trusses, gussets, etc.) 1023 may be formed between adjacent surfaces of the jacket 1021, and a plurality of vertical supports 1015 may be formed between opposite surfaces of the jacket 1021 under the interposer to further strengthen the sensor package 1000 and reduce the likelihood of the jacket 1021 collapsing or bending when the vacuum is formed therein. In some embodiments, the supports inside the vacuum space 1020 may be re-entrant structures having various suitable geometries, including hexagonal, arrowheads, Lozenge grid, square grid, and star system. The jacket supports 1015 and 1023 may have thickness or diameter in a range of about 100 µm to about 2 mm.

The interior of the vacuum space 1020 including the jacket supports 1015 and 1023 may be coated by a reflective coating, such as the reflective coating on the exterior of the sensor package 1000. The reflective coating may be applied by, as some examples, a multi-material printing process or by printing a metal seed layer and performing electroless plating. The configuration of the lattice structure 1015 and 1023 is not particular limited, and in addition to the angled column or truss structure 1023 shown in FIG. 1A, a "+" shape lattice, an "X" shape lattice, and/or a combination thereof are contemplated as well.

A plurality of grooves (e.g., electrical interconnect channels) 1030 may be provided in the sensor package 1000 to accommodate wire traces (e.g., electrical feedthroughs) connecting the positional sensor to an external device, and an insulating spacer 1040 may be arranged (or formed) over the grooves 1030. As will be further described below, when the metal traces are formed concurrently with the sensor package 1000, the metal traces may be printed into the grooves 1030 and then covered by a material (e.g., a ceramic material coated with a metal on an upper surface thereof) to form the insulating spacer 1040, thereby insulating (e.g., electrically insulating) the metal traces from each other and from external interference and forming the sensor package 1000. The metal coating on the insulating spacer 1040 may improve a bonding seal with a lid 1041, which is attached thereto and seals a space between the jacket 1021 at where the interposer is arranged. In other embodiments, however, the metal traces may be formed later by, for example, plating, soldering, laser-induced forward transfer technique, etc.

The lid 1041 (shown in dotted lines to avoid obscuring other components and/or elements) may be attached over an upper surface of the sensor package 1000, such as on an upper surface of the jacket 1021 or on an upper surface of the insulating spacer 1040 to form the sensor package 1000. For example, the lid 1041 may be attached to (e.g., sealed and/or bonded with) the insulating spacer 1040. The lid 1041 may include an internal vacuum space. Further, the area between the lid 1041 and the interposer may be formed as a vacuum (e.g., the air inside the volume between the lid 1041 and the inner area of the jacket 1021 may be subjected to a vacuum) to improve thermal insulation.

The inner pad 1001, the outer pad 1002, and the stress isolating structure 1003 are formed over an upper part of the jacket 1021 (hereinafter referred to as a shelf 1022). Further, the outer pad 1002 is connected to the jacket 1021 via a plurality of protrusions 1004. However, in some embodiments, the protrusions 1004 may be omitted based on the support structures 1010 and 1011 (e.g., a first group of supports 1010 and a second group of supports 1011) formed under the outer pad 1002.

A plurality of supports (e.g., support posts or columns and/or a three-dimensional matrix of lattices) 1010 and 1011 extend between the shelf 1022 and the outer pad 1002. The supports 1010 and 1011 provide structural support for the outer pad 1002 and, indirectly, to the stress isolating structure 1003 and the inner pad 1001. For example, no supports may be formed under the stress isolating structure 1003 or under the inner pad 1001 (e.g., the stress isolating structure 1003 and the inner pad 1001 may float over the shelf 1022). The supports 1010 and 1011 may have a width, thickness, or diameter in a range from about 10 µm to about 300 µm. The supports 1010 may be arranged in the outer one-quarter or more (e.g., outer one-half or outer three-quarters) of the radial distance of the sensor package 1000, measured from a center thereof and may be larger than the supports 1011 arranged nearer to the inner pad 1001. Without limitation, the supports 1011 may be arranged freely between the inner pad 1001 and supports 1010 in a radial direction from the inner pad 1001 to an outer wall of the jacket. Without the supports 1010 and 1011, the interposer may sag or collapse altogether. By including the supports 1010 and 1011, the outer pad 1002 is supported (e.g., is vertically supported or is supported in a vertical direction), thereby allowing the relatively large outer pad 1002, stress isolating structure 1003, and inner pad 1001 to be formed (e.g., 3D printed) without sagging or collapsing. The protrusions 1004 may act as additional horizontal support tabs for the interposer and may provide a space for electrical routings.

In the sensor package 1000 illustrated in FIGS. 1A and 1B, the supports 1010 and 1011 are only arranged between the outer pad 1002 and the shelf 1022 and no supports (e.g., no vertical supports) extend between the inner pad 1001 and the shelf 1022 or between the stress isolating structure 1003 and the shelf 1022. As will be discussed later in more detail, by arranging the supports 1010 and 1011 under the outer pad 1002 but not under the inner pad 1001 and/or under the stress isolating structure 1003, an optimal balance between supporting interposer during manufacture and in use while also isolating the positional sensor, which is mounted on the inner pad 1001, from stress during use is achieved. For example, energy (e.g., vibrations, thermal energy, etc.) imparted to the sensor package 1000 from the external environment is attenuated by the vacuum space 1020 and also by the stress isolating structure (e.g., stress relieving structure) 1003, reducing or minimizing external interference imparted on the positional sensor.

Figure 2A:
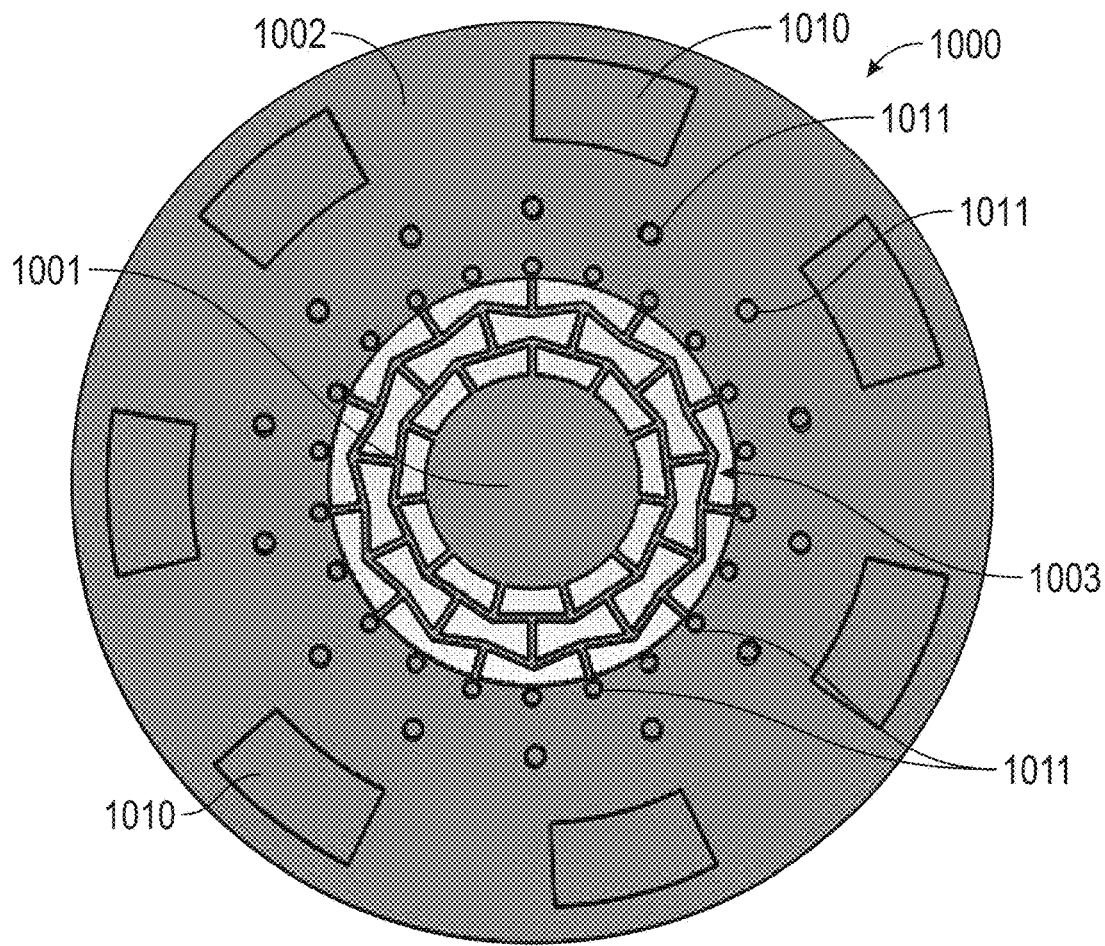
FIG. 2A is a top-down view of an interposer of the sensor package shown in FIG. 1A.
Figure 2B:
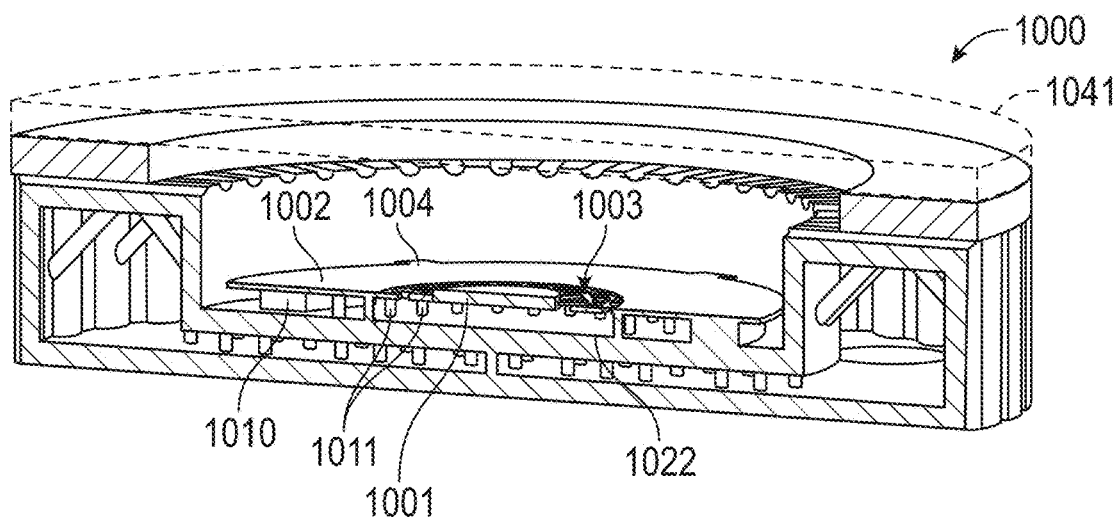
FIG. 2B is a perspective cross-sectional views of the sensor package shown in FIGS. 1A and 1B.

FIGS. 2A and 2B show a top-down view and a perspective cross-sectional view, respectively, of the sensor package 1000 shown in FIGS. 1A and 1B. Referring to FIGS. 1-2B, the supports 1010 are larger than the supports 1011. For example, the supports 1010 may have an approximately rectangular shape curved to correspond to the circular shape of the inner and outer pads 1001 and 1002. For example, as can be seen in FIG. 2A, seven supports 1010 are arranged along a circle surrounding the stress isolating structure 1003 and the inner pad 1001, and the supports 1010 are spaced equidistant from each other. The present invention, however, is not limited thereto. The supports 1010 are arranged further from the inner pad 1001 than the supports 1011 are; as such, the supports 1010 may be referred to as the outer supports 1010, and the supports 1011 may be referred to as the inner supports 1011. In some embodiments, the outer supports 1010 may have a length of about 3.5 mm, a width of about 1.75 mm, and may be spaced from the outer edge of the outer pad 1002 by about 0.75 mm.

The inner supports 1011 as may be columns or the like and may be arranged along circles (e.g., arranged along concentric circles) around the stress isolating structure 1003 and the inner pad 1001. The present invention, however, is not limited thereto, and the inner supports 1011 may be sporadically and/or alternately arranged under the outer pad 1002 between the outer supports 1010 and the stress isolating structure 1003. The inner supports 1011 may have a diameter of about 0.40 mm, but the present invention is not limited thereto.

In some embodiments, such as is described below with respect to FIG. 3A, additional supports may be arranged between the stress isolating structure 1003 and the shelf 1022. However, by including additional supports under the stress isolating structure 1003, additional thermal energy is transmitted to the inner pad 1001 and, therefore, to the positional sensor on the inner pad 1001, thereby negatively affecting the performance (e.g., the accuracy) of the positional sensor.

In embodiments including the additional supports (e.g., the supports between the shelf 1022 and the stress isolating structure 1003), the size (e.g., the diameter) of the supports may decrease as the supports near the inner pad 1001. For example, the inner supports 1011 may have a diameter of about 0.40 mm, the additional supports in the outermost ring of unit cells of the stress isolating structure 1003 may have a diameter of 0.24 mm, the additional supports in the next nearest ring of unit cells of the stress isolating structure 1003 to the inner pad 1001 may have a diameter of about 0.20 mm, and the additional supports in the nearest ring of unit cells of the stress isolating structure 1003 to the inner pad 1001 may have a diameter of about 0.15 mm, but the present invention is not limited thereto. As the number of rings of unit cells is varied, the size of the additional supports in each ring of unit cells may be suitably adjusted accordingly, with the diameters of the additional supports decreasing or at least not increasing as the unit cells near the inner pad 1001.

Figure 3A:
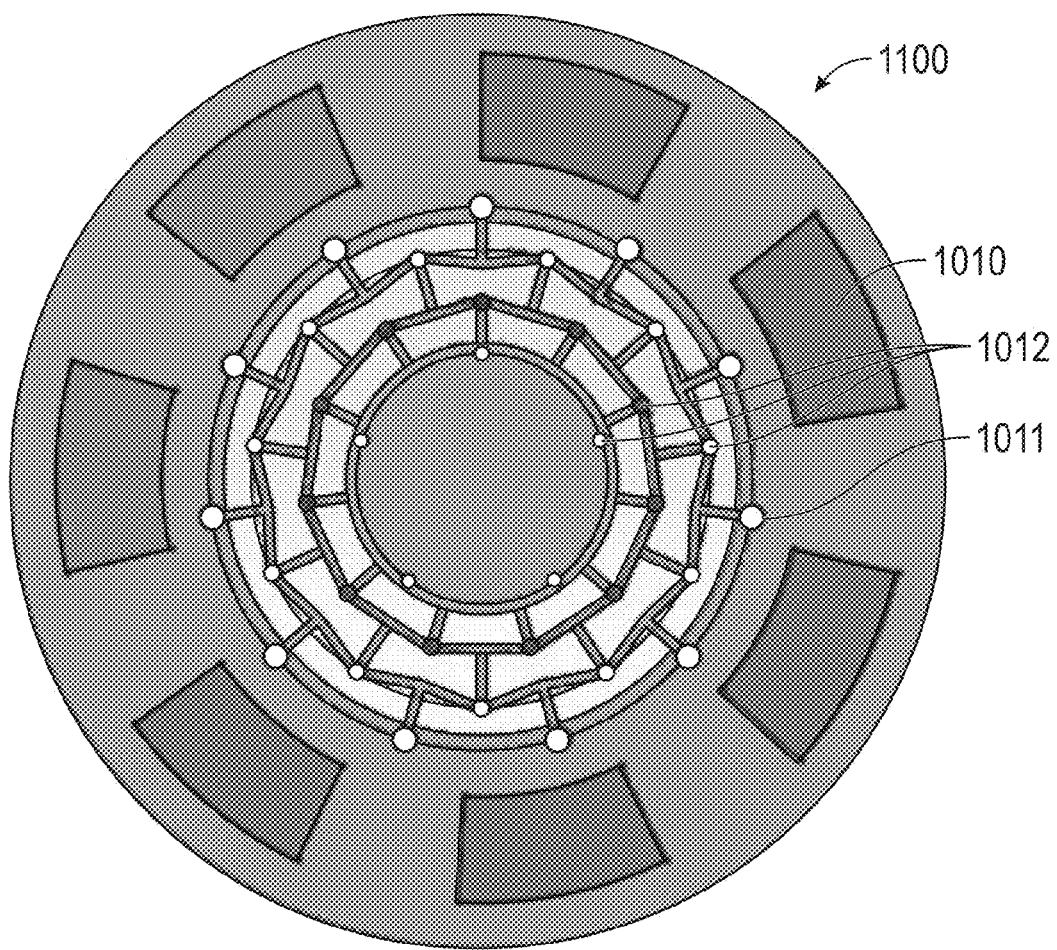
FIGS. 3A-4C show finite element analyses (FEA) of different sensor packages according to embodiments of the present invention.
Figure 3B:
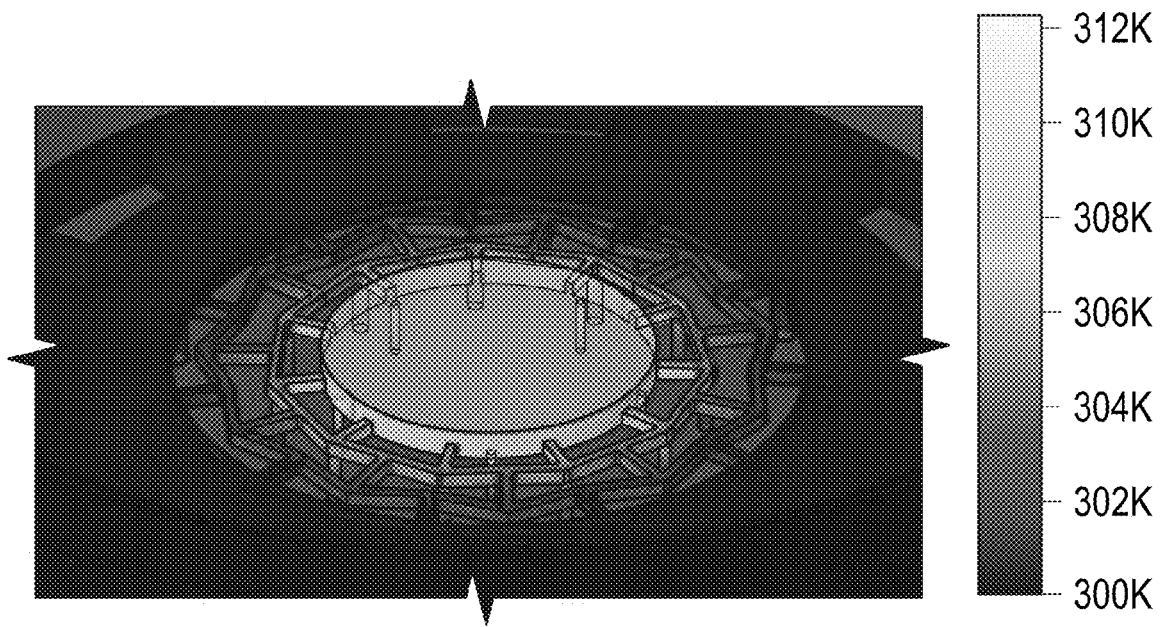
Figure 3C:
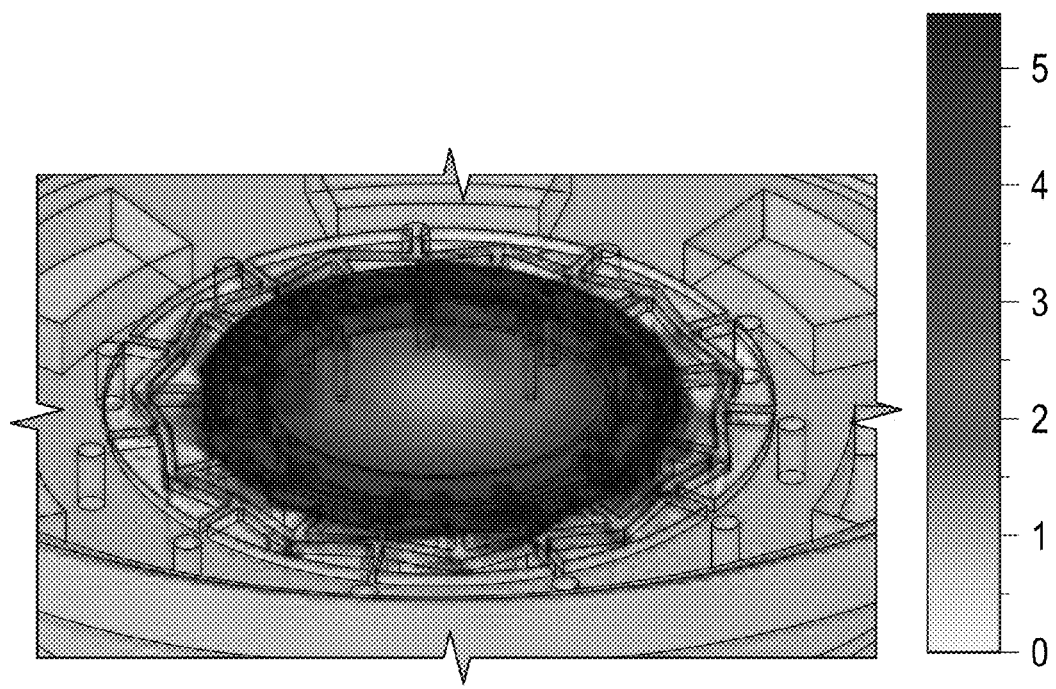

Referring to FIGS. 3A-4C, two embodiments of a sensor package 1100 and 1000 having different support structures were modeled using finite element analysis (FEA) software. The results of the FEA analysis are shown in Table 1 and FIGS. 3B, 3C, 4B, and 4C. Referring to FIGS. 3A-3C, the sensor package 1100 includes the supports (e.g., the outer supports) 1010 under the outer pad 1002, the supports (e.g., the inner supports) 1011 under the inner edge of the outer pad 1002 interfacing the stress isolating structure 1003, and additional supports 1012 at every row of unit cells of the stress isolating structure 1003. FIG. 3B shows surface temperature gradient of the sensor package 1100 (e.g., of the interposer of the sensor package), and FIG. 3C shows frequency eigenvalue surface displacement of the interposer of the sensor package 1100. FIG. 3A illustrates the surface temperature gradient that results from a fixed heat load (e.g., 10 mW) applied to the inner pad 1001 of the interposer. The frequency eigenvalue indicates the frequency of the fundamental out of plane mechanical mode of the interposer. As can be seen in FIG. 3B, there is relatively little surface temperature gradient from the outer pad 1002 to the inner pad 1001 (e.g., about 12K overall gradient) as the additional number of supports (e.g., the presence of the additional supports 1012) allows for more thermal energy transfer from the inner pad 1001 to the outer pad 1002. And as can be seen in FIG. 3C, there is relatively low displacement of the inner pad 1001 due to the additional supports 1012 under the stress isolating structure 1003.

Figure 4A:
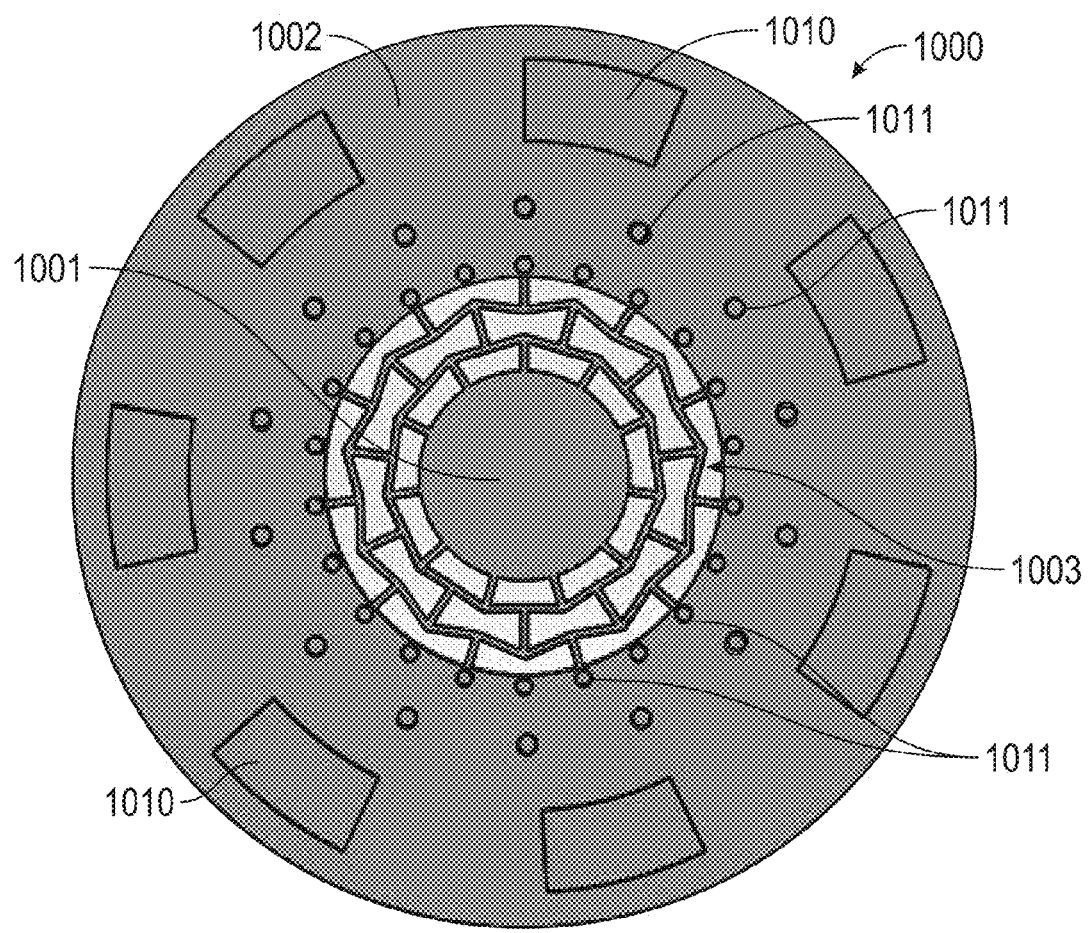
Figure 4B:
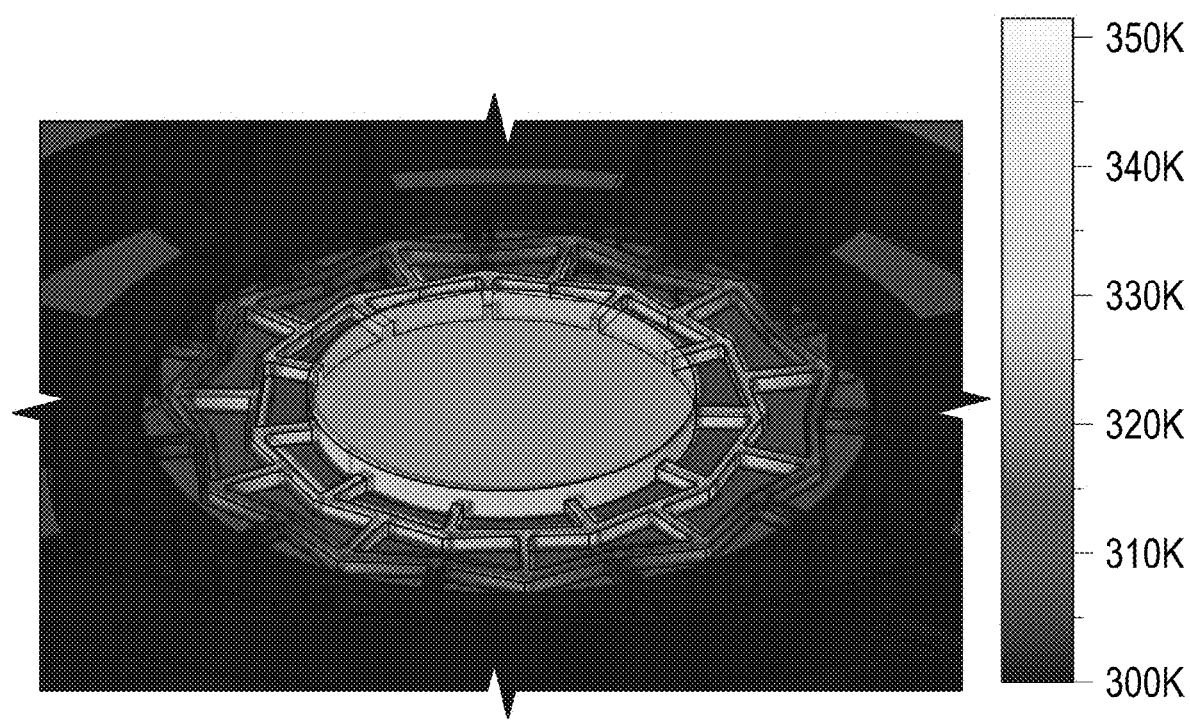
Figure 4C:
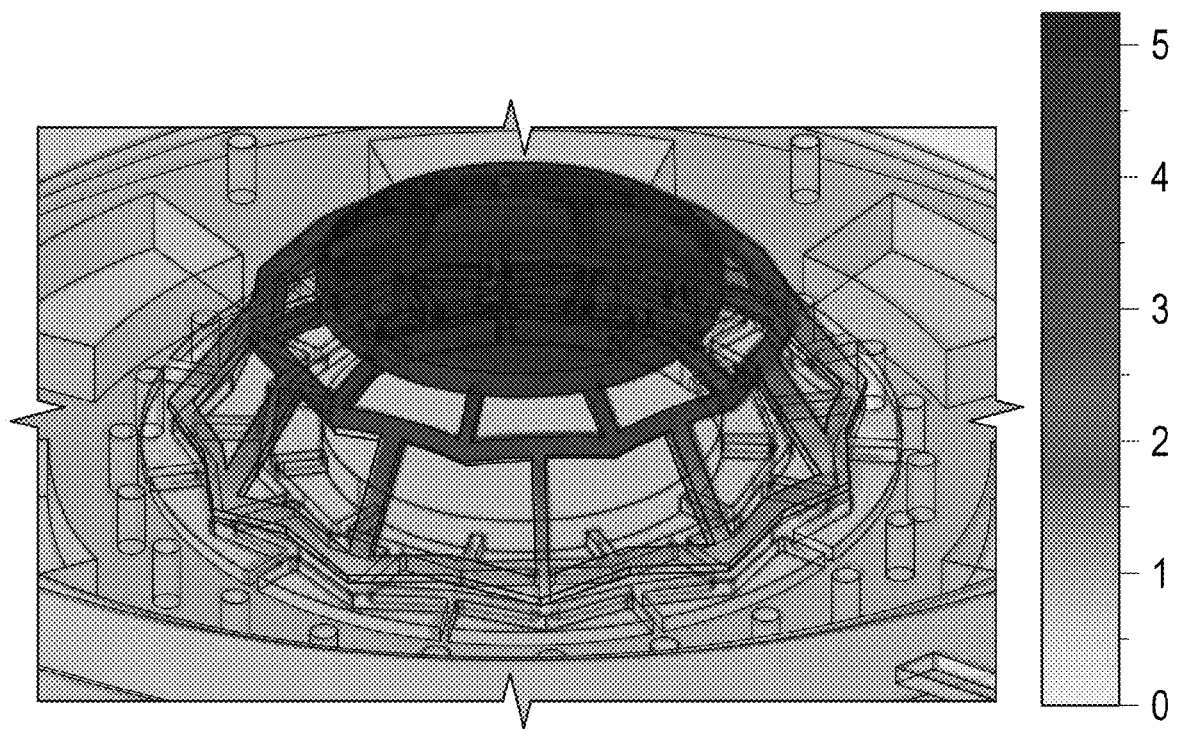

The sensor package 1000 shown in FIG. 4A is the same as the sensor package 1000 shown in FIGS. 1A-2B and omits the additional supports 1012. As can be seen in FIG. 4B, there is a relatively high thermal gradient between the outer pad 1002 and the inner pad 1001 due to, at least in part, the lack of supports between the stress isolating structure 1003 and the shelf 1022 further insulating the inner pad 1001 from the surrounding elements of the interposer 1200. As can be seen in FIG. 4C, however, there is relatively higher mechanical energy transfer to the inner pad 1001 due to the lack of supports between the stress isolating structure 103 and the shelf 1022 compared with sensor package shown in FIG. 3C.

Table 1 (below) shows the surface temperature gradient and Eigenvalue surface displacement for sensor packages having different support structures.

TABLE 1

| Example: | Surface Temperature Gradient (K) | Eigenfrequency of Displacement (kHz) |
|---|---|---|
| Example 1 (FIGS. 3A-3C) | 12 | 68 |
| Example 2 | 18 | 44 |
| Example 3 | 25 | 36 |
| Example 4 | 37 | 16 |
| Example 5 (FIGS. 4A-4C) | 50 | 10 |

Example 1 refers to the sensor package shown in FIG. 3A, which includes supports 1010 and 1011 under the outer pad 1002 and additional support 1012 under each row of the unit cells of the stress isolating structure 1003.

Example 2 refers to a sensor package having supports 1010 and 1011 under the outer pad 1002 and under each row of the unit cells of the stress isolating structure 1003 except for the innermost row thereof (e.g., the row of the unit cells nearest to the inner pad 1001).

Example 3 refers to a sensor package similar to Example 2 but with a reduced number of supports.

Example 4 refers to a sensor package having supports 1010 and 1011 under the outer pad 1002 and additional supports 1012 under only the outermost row of the unit cells of the stress isolating structure 1003 (e.g., the row of the unit cells of the stress isolating structure 1003 farthest from the inner pad 1001).

Example 5 refers to the sensor package shown in FIG. 4A with supports 1010 and 1011 only under the outer pad 1002 and no supports under the stress isolating structure 1003.

As can be seen in Table 1, as the number of supports decreases, the surface temperature gradient increases and the eigenfrequency surface displacement decreases.

This allows for an increase in the thermal gradient between the sensor and the environment for thermal isolation, as long as the eigenfrequency of the structure does not overlap with any resonant modes of the sensor. However, as discussed further below, as the number of supports is reduced, the difficulty in manufacturing the sensor package increases and the risk of the stress isolating structure 1003 and/or the inner pad 1001 collapsing during manufacture increases.

Figure 5:
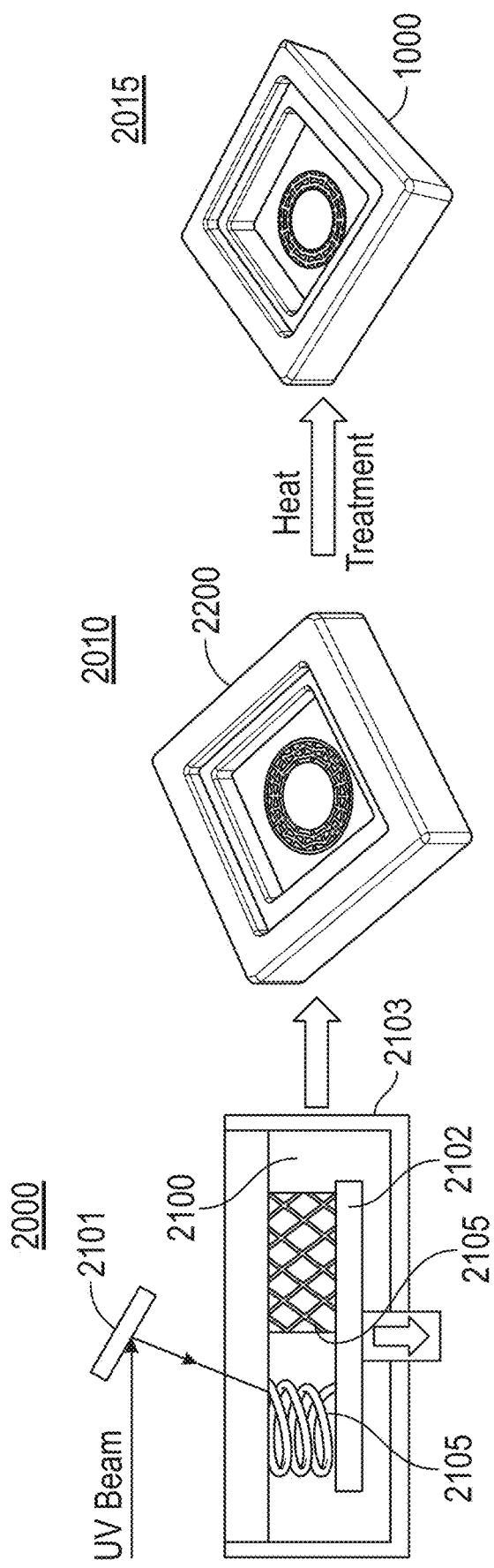
FIG. 5 illustrates a method of manufacturing a sensor package according to an embodiment of the present invention.

A method of manufacturing a sensor package according to an embodiment of the present invention is shown in FIG. 5. In FIG. 5, an ultra-violet (UV)-based three-dimensional (3D) printing technique is shown, but the present invention is not limited thereto. In this case, the UV light may have a wavelength in a range from 200 nm to 500 nm. For example, in other embodiments, the sensor package 1000 may be manufactured by using other suitable three-dimensional (3D) printing techniques, such as stereolithography, digital light projection, direct ink writing, ink jetting, and suitable hybrid techniques including one or more of the above-mentioned techniques. Other suitable digital printing techniques include selective laser sintering (SLS), material jetting (MJ), drop on demand (DOD), binder jetting, and laser induced forward transfer (LIFT), etc.

First, a UV-curable preceramic resin 2100 is filled into a tank (or other holding device) 2013 (act 2000). In other embodiments, a thermally-curable preceramic resin may be used in place of the UV-curable preceramic resin. The preceramic resin may include silicon oxycarbide, silicon oxycarbonitride, silicon carbonitride, silicon carbide, silicon nitride, and mixtures thereof. The preceramic resin may include a sacrificial binder mixed with sinterable ceramic particles. The sacrificial binder may include a monomer, oligomer, and/or polymers that include groups, such as acrylates, unsaturated hydrocarbons (with double and/or triple bonds), epoxy, thiols, and/or isocyanate. The ceramic particles may include alumina, silica, silicon, mullite, boron nitride, etc., may have a spherical, platelet, whisker, and/or fiber shape, and a size in a range of about 1 nm to about 0.5 mm. The preceramic resin may include other fillers for strengthening, stress isolating, tuning ductility, tuning electrical and/or thermal conductivity, tuning dielectric performance. The other fillers may include ceramic particles and/or metal particles.

In some embodiments, the preceramic resin may include ceramic filler particles with an average size in a range of about 0.1 μm to about 15 μm, and a volume fraction of the ceramic particles may be in a range of about 0 to about 80%. Suitable ceramic filler particles include alumina, mullite, silica, aluminosilicate, silica-based glasses, silicon nitride, silicon carbide, zirconia, boron nitride, magnesium aluminate spinel ($MgAl_2O_4$), yttrium aluminate garnet ($Y_3Al_5O_{12}$), rare earth silicates, such as $YSiO_5$ and $Y_2Si_2O_7$, aluminum phosphate ($AlPO_4$), and mixtures thereof. The ceramic mixture can be amorphous or crystalline.

Then, a UV beam is irradiated (e.g., is selectively irradiated) onto the UV-curable preceramic resin 2100 via a scanning mirror 2101 to selectively print (e.g., to form or cure) the cured preceramic resin 2105 layer-by-layer to form a green-state polymer package 2200 (acts 2000 and 2010). The green-state polymer package 2200 may be formed on a stage 2102. The stage 2102 may incrementally move downwardly (e.g., away from the light source) as layers of the green-state polymer package 2200 are formed. The green-state polymer package 2200 has the final shape of the sensor package 1000.

In other embodiments, a polymer (e.g., a UV-curable polymer) can be used in place of the UV-curable preceramic resin. However, the polymer may not be strong (or rigid) enough to support an internal vacuum. Thus, when a polymer is used instead of a ceramic, the jacket 1021 may be filled with a thermal insulation material to provide thermal insulation similar to that which is provided by the vacuum space 1020.

Then, the green-state polymer package 2200 is heat treated to form the sensor package 1000 (act 2015). The sensor package 1000 may be a single, integral component because it is formed via three-dimensional printing. As such, the sensor package 1000 may have relatively consistent characteristics (e.g., the material properties may be uniform or substantially uniform across the sensor package 1000 and the properties of the sensor package 1000 may be repeatable from one manufacturing run to another) and high strength.

The heat treating may occur at temperatures in a range from 150° C. to 1,800° C. in an atmosphere of air, argon, nitrogen, hydrogen, oxygen, ammonium, silanes, or a mixture thereof. When an amorphous ceramic is used to form the green-state package 2200, the heat treating may occur at temperatures in a range of 1,000° C. to 1,200° C. When a crystalline ceramic, such as SiC or $Al_2O_3$, is used to form the green-state package 2200, the heat treating may occur at temperatures in a range of 1,500° C. to 1,800° C. The atmosphere may be varied based on the material of the green-state package 2200. For example, when the green-state package 2200 is formed of $Al_2O_3$, a $O_2/N_2$ ambient atmosphere may be used. When the green-state package 2200 is formed of a silicon-based ceramic, an Ar and/or $N_2$ may be used. When the green-state package 2200 is formed of crystalline ceramic, such as SiC, $Si_3N_4$, or SiCN, an atmosphere of hydrogen, ammonium, and/or silanes may be used.

In one embodiment, the green-state polymer package 2200 is pyrolyzed in flowing argon (Ar) gas by heating at 1° C. per minute to a temperature of about 1,000° C. and holding the about 1,000° C. temperature for about one hour. Due to the heat treatment, preceramic resin is converted to, in some embodiments, silicon oxycarbide (SiOC) ceramic with a thermal conductivity of about 1.8 W/mK. The SiOC ceramic has a CTE in a range of about 2.6 to about 5 ppm per ° C. and a thermal conductivity in a range of about 1.1 to about 5 W per centimeter per ° C., similar to that of silicon (Si), which may be a primary element of the positional sensor. For example, silicon (Si) has a CTE in a range of about 2.6 to about 3.2 ppm per ° C. and a thermal conductivity in a range of about 1.56 to about 1.05 W per centimeter per ° C.

After the heat treatment, a vacuum is pulled in vacuum space 1020 through one or more openings (e.g., holes) 1021.1 formed in the jacket 1021 (see, e.g., FIGS. 1A and 1B) during the manufacturing process to access the vacuum space 1020. The opening(s) 1021.1 in the jacket 1021 may be large (e.g., millimeter size) or tiny (e.g., micron size). Then, the opening(s) 1021.1 in the jacket 1021 are sealed to maintain the vacuum, thereby forming the vacuum space 1020. The opening(s) 1021.1 may be sealed by hermetic cap sealing/soldering by using a gold/tin preform or an extra cap/plug may be printed and then coated with the gold/tin preform. In other embodiments, a seal glass may be formed over the opening(s) 1021.1 in the jacket 1021 in a vacuum state, and the seal glass may be heat treated at a temperature of about 800° C. to about 1,000° C.

By using additive manufacturing processes (e.g., 3D printing processes) to manufacture the sensor package 1000, the sensor package 1000 may be a single, integral component, providing a relatively strong component with consistent properties throughout. However, because the outer pad 1002, inner pad 1001, and stress isolating structure 1003 together present a relatively large surface area, there are concerns of sagging or collapse of one or more of these components during manufacture or use. Thus, as described above, supports (e.g., outer supports 1010, inner supports 1011, and/or additional supports 1012) may be included between the shelf 1022 and the outer pad 1002 and/or the stress isolating structure 1003 to ensure sufficient strength and support for the outer pad 1002 and/or stress isolating structure 1003 and, indirectly to the inner pad 1001, during manufacture and use.

In some embodiments, metal traces (e.g., interconnects or interconnections) may be printed into the grooves 1030 (see, e.g., FIG. 1A) either concurrently with the formation of the green-state polymer package 2200, consequently onto the green-state polymer package 2200, or after the heat treatment of the green-state polymer package 2200 (e.g., may be printed on the sensor package 1000). For example, direct ink printing (or direct ink writing) may be used to deposit metal, such as silver (Ag) ink and/or silver (Ag) paste, into the grooves 1030. In other embodiments, the metal traces may be formed by soldering, material jetting, or laser induced forward transfer techniques. When silver (Ag) paste is deposited onto the green-state polymer package 2200, the silver (Ag) paste may not diffuse into the surrounding material during the heat treating of the green-state polymer package 2200 and the metal interconnects may not bleed, providing a more robust electrical connection without necessitating a second heat treatment to form the metal traces.

When the metal traces are formed by soldering, they may be formed after the heat treatment process so the metal traces are not reflowed during heat treatment. When the direct ink writing or material jetting techniques are used, a mixture of metal fillers and binders may be dispensed into the grooves 1030 and then cured. The binders may be UV-curable and/or thermally-curable organic and/or organometallic materials. The mixture of metal fillers and binders may be deposited onto either the green-state polymer package 2200 prior to heat treatment or onto the heat-treated sensor package 1000. When the metal fillers and binders are printed on the heat-treated sensor package 1000, a supplemental heat treatment at a temperature of greater than about 500° C. may be used to ensure the metal traces are properly formed. When the metal fillers and binders are printed on the green-state polymer package 2200 prior to heat treatment a single heat treatment may convert the polymer into ceramic and form the metal traces.

In addition, in some embodiments, a heater and/or thermal probe may be printed on the green-state polymer package 2200 or the heat-treated package 1000 (or any other suitable interposer or package at any suitable stage of manufacture), in the same or substantially the same way of forming electrical traces, providing additional placement options for these add-on devices.

FIGS. 7-11 show different configurations of a sensor package including an interposer according to embodiments of the present invention.

Figure 7:
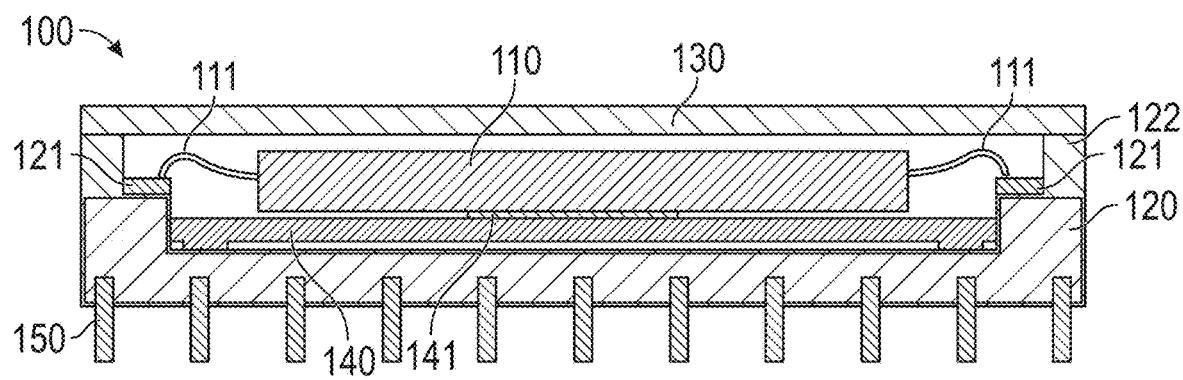
FIGS. 7-11 show different sensor packages according to embodiments of the present invention.

Referring to FIG. 7, a sensor package 100 includes a jacket 120, a positional sensor 110, an interposer 140 on which the positional sensor 110 arranged, a lid spacer 122, and a lid 130. In some embodiments, the lid spacer 122 and the lid 130 may be integrally formed and attached to (e.g., sealed to) the jacket 120. The interposer 140 may be any of the above-described embodiments. In other embodiments, the lid spacer 122 may be omitted such that the lid 130 is sealed (e.g., directly sealed) to the jacket 120. In some embodiments, the lid 130 may be manufactured by using a 3D printing process, similar to the sensor package 1000 as described above. In such an embodiment, the lid 130 may have a vacuum space and may include a support structure therein, similar to the vacuum space 1020 of the sensor package 1000. As discussed further below, the sensor package 100 may include a plurality of leads (e.g., pins) 150 for electrical connection to an external device.

The lid 130 may be sealed (e.g., welded, brazed, etc.) to the jacket 120 via the lid spacer 122 to hermetically seal an area enclosed by the jacket 120, the lid spacer 122, and the lid 130. The area enclosed by the jacket 120, the lid spacer 122, and the lid 130 may be in a high vacuum state. Together, the jacket 120, the lid spacer 122, and the lid 130 may protect the positional sensor 110 from external elements, such as oxygen and moisture, and impacts.

The sensor package 100 may be only slightly larger than the positional sensor 110. For example, the positional sensor 110 may be about 1 mm away from (e.g., may be spaced about 1 mm from) the inner surface of each of the jacket 120 and the lid 130. The sensor package 100 may act as a chip carrier. The sensor package 100 may include a plurality of leads (e.g., pins), and in some embodiments, the sensor package 100 may include 44 pins, but the sensor package 100 is not limited to 44 pins. The sensor package 100 may include any suitable number of pins.

The positional sensor 110 may be arranged on (e.g., secured to) the interposer (e.g., onto the inner pad 1001 of the sensor package 100). For ease of convenience, the inner pad 1001, stress isolating structure 1003, and outer pad 1002 are collectively referred as the interposer 140 in FIGS. 7-11. A bond layer (e.g., an adhesive layer) 141 may be provided between the interposer 140 and the positional sensor 110 to secure the positional sensor 110 to the interposer 140.

Electric signals may be sent from and/or received by the positional sensor 110 via wirings 111, which are connected to interconnects arranged in the grooves 1030 (see, e.g., FIG. 1A) in the sensor package 100. The interconnects may be electrically connected to the leads 150, and some of the wirings 111 may provide power to the positional sensor 110 from an external power source via the interconnects. In some embodiments (see, e.g., FIGS. 9 and 10), additional interconnects may be formed (e.g., printed) on the surface of the interposer 140 (e.g., on the surface of the inner pad 1001, stress isolating structure 1003, and outer pad 1002) such that the wirings 111 may be omitted and electrical signals are transmitted from the interconnects in the grooves 1030 to the positional sensor 110 along the additional interconnects on the surface of the interposer 140.

Figure 8:
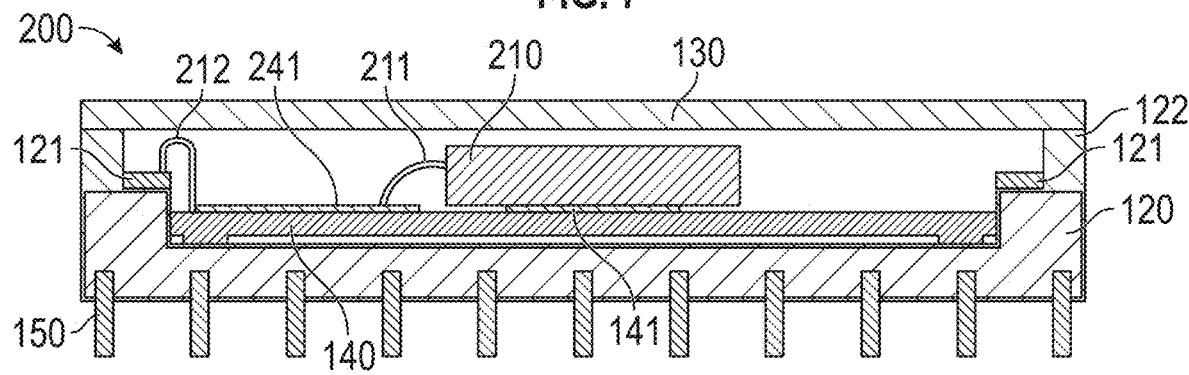

Referring to FIG. 8, a sensor package 200 includes a positional sensor 210 and the interposer 140. The positional sensor 210 may be the same or substantially similar to the positional sensor 110 described above. In this embodiment, the sensor package 200 includes electrical connections (e.g., electrical traces) 241 printed on the interposer 140 (e.g., printed on the outer pad 1002, the stress isolating structure 1003, and/or the inner pad 1001). The electrical connections 241 may be metalized portions of (e.g., metalized traces formed on) the interposer 140. The positional sensor 210 may be electrically connected to the leads 150 via wirings 211 extending between the positional sensor 210 and the electrical connections 241 and wirings 212 extending between the electrical connections 241 and the pads 121. When the positional sensor 210 is substantially smaller than the sensor package 200, electrically connecting the positional sensor 210 to the pads 121 via the interposer 140 instead of to the pads 121 via wires may provide a more robust electrical connection by reducing overall wiring length. In some embodiments, both direct wire connections between the positional sensor 210 and the pads 121 and electrical connections 241 on the interposer 140 may be used in combination.

Figure 9:
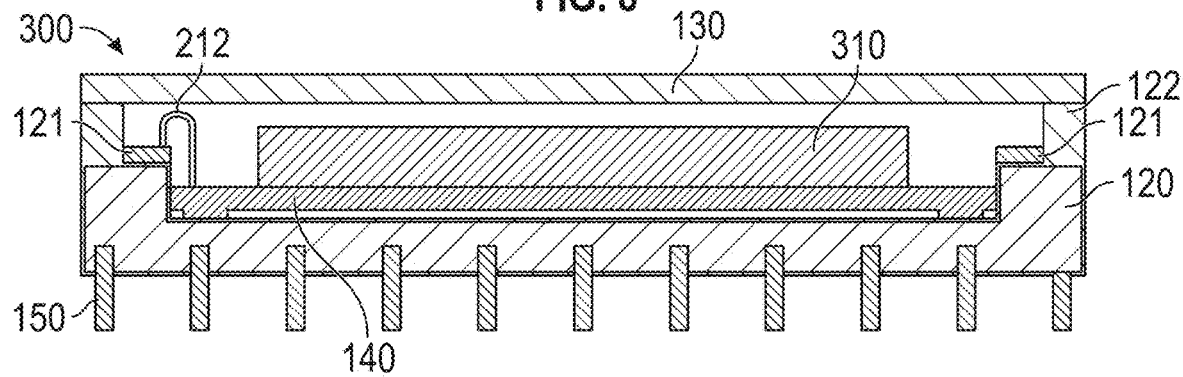

Referring to FIG. 9, a sensor package 300 includes an integral positional sensor 310 and interposer 140. In this embodiment, the positional sensor 310 may be integral with (e.g., may be integrated with) the interposer 140. Here, integral may indicate that the bonding between the positional 310 sensor and the inner pad 1001 is at wafer level, so the sensor can be bonded both mechanically and electrically to the inner pad 1001 through electrical routings. As such, overhang wire bonding may be omitted. The interposer 140 may also include electrical connections 241 as described above.

Figure 10:
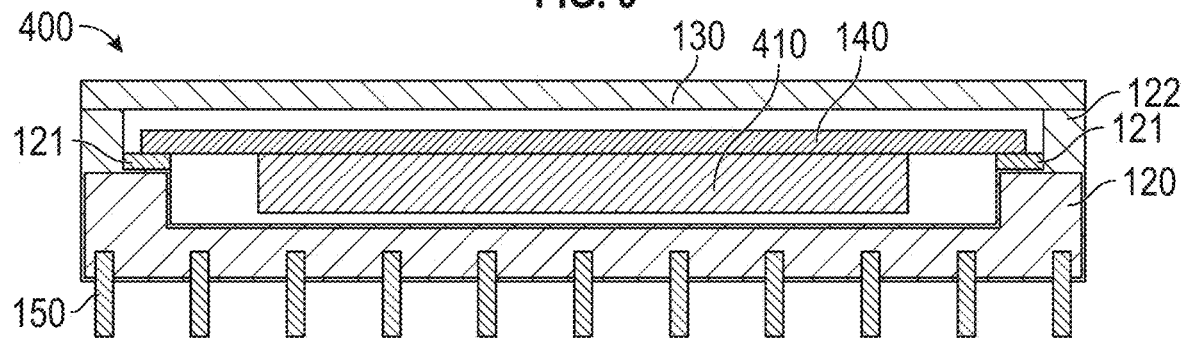

Referring to FIG. 10, a sensor package 400 includes a positional sensor 410 and the interposer 140. Different from the sensor package 100 shown in FIG. 7, in this embodiment the positional sensor 410 is arranged between the interposer 140 and the jacket 120 rather than between the lid 130 and the interposer 140 as shown in FIG. 7. Further, in this embodiment, the interposer 140 may be directly connected to the pads 121. Thus, when the interposer 140 includes electrical connections, similar to the electrical connections 241 described above, a wiring between the positional sensor 410 and the pads 121 or between the interposer 140 and the pads 121 may be omitted. In other embodiments similar to FIG. 10, the interposer 140 may be printed and/or heat treated separately, then bonded to the positional sensor 410.

Then, the combined positional sensor 410/interposer 140 may be bonded to the pads 121.

Figure 11:
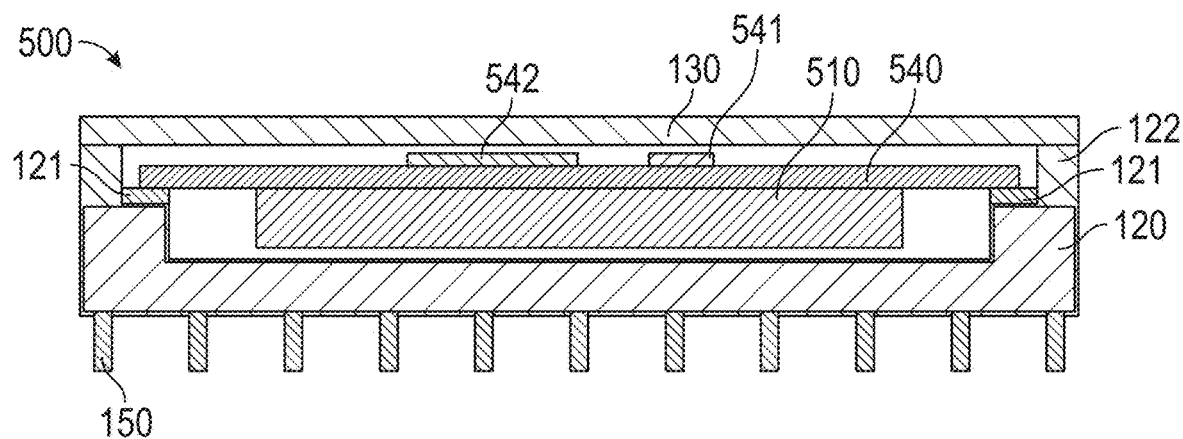

Referring to FIG. 11, a sensor package 500 includes a positional sensor 510 arranged on an interposer 540, a thermometer (e.g., a thermal probe) 541, and a heater 542. The thermometer 541 may be a resistance temperature detector (RTD), which includes a small piece of metal, such as Pt, Ni, or Cu, and the heating element is a metal wire, such as Ni or Cu. Both the piece of metal and the metal wire may be printed with the package 500 (e.g., integrally formed with the package 500) or printed on a finished package 500 similar to how electrical interconnects are printed. The heater 542 and the thermometer 541 may be placed at the center area of the sensor package 500 so as to uniformly heat the positional sensor 510. The thermometer 541 and the heater 542 may operate in conjunction with each other and/or a controller or the like to maintain the positional sensor 510 at or above a threshold temperature. In some embodiments, the thermometer 541 may be used to determine when the positional sensor 510 has exceeded a temperature threshold (e.g., too high a temperature or too low a temperature) over which output quality from the positional sensor 510 may be substantially degraded. When the positional sensor 510 is too cold, the heater 542 may be used to heat the positional sensor 510 to be above the temperature threshold.

Further, as described above, the thermometer 541 and the heater 542 may be formed concurrently with the interposer 540. For example, the interposer 540 may be integrally formed with the thermometer 541 and the heater 542. In addition, the thermometer 541 and the heater 542 may be included in any suitable orientation. For example, the thermometer 541 and the heater 542 may be formed between the inner pad 1001 and the shelf 1022 (see, e.g., FIG. 1A) to more directly heat the positional sensor 510. And when the thermometer 541 and the heater 542 are formed integrally with the interposer 540, the thermometer 541 and the heater 542 may be formed to be surrounded by the interposer 540.

As would be understood by those of ordinary skill in the art, the various features, aspects, components, arrangements, and configurations described in the embodiments shown in FIGS. 7-11 may be variously mixed and modified between the different embodiments. For example, the arrangement of the positional sensor being between the lid and the interposer may be combined with the features of the interposer being directly connected to the pads, etc.

Figure 12:
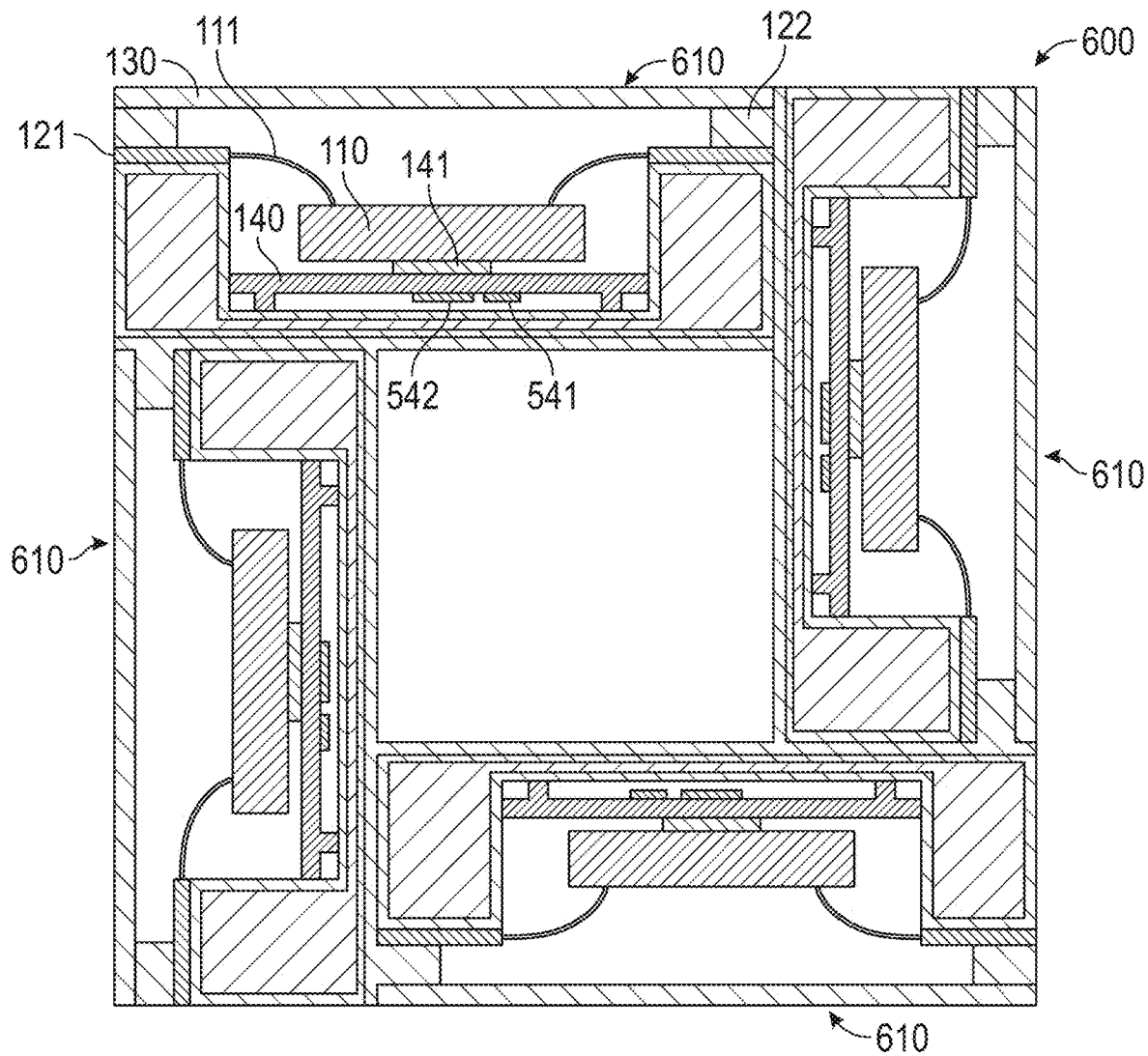
FIG. 12 shows a sensor cluster according to an embodiment of the present invention.

FIG. 12 shows a sensor cluster 600 including a plurality of sensor packages 610. Each of the sensor packages 610 includes the interposer 140, the positional sensor 110, the lid spacer 122, and the lid 130. Each sensor package 610 further includes the thermometer 541 and heater 542 arranged between the interposer 140 (e.g., the inner pad 1001) and the shelf 1022. The sensor cluster 600 includes four of the sensor packages 610, each arranged at about 90° with respect to an adjacent sensor package 610. By using a cluster of four sensor packages 610, a two-axis positional (e.g., acceleration) output can be provided. However, the present invention is not limited thereto, and in other embodiments, a sensor cluster may include any suitable number of sensor packages 610, for example, arranged in a 3D polyhedron.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that such spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a" and "an" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the terms "exemplary" and "example" are intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein.

Although example embodiments of a stress isolating interposer, a sensor package including the interposer, and a method of manufacturing the interposer and the sensor package have been described and illustrated herein, many modifications and variations within those embodiments will be apparent to those skilled in the art. Accordingly, it is to be understood that a stress isolating interposer, a sensor package including the interposer, and a method of manufacturing the same according to the present invention may be embodied in forms other than as described herein without departing from the spirit and scope of the present invention. The present invention is defined by the following claims and equivalents thereof.

What is claimed is:

1. A stress isolating interposer comprising:
   a jacket having a first vacuum space therein;
   an outer pad surrounded along its periphery by the jacket;
   an inner pad configured to accommodate a positional sensor; and
   a stress isolating structure coupling the outer pad and the inner pad to each other,
   wherein the outer pad, the stress isolating structure, and the inner pad is a monolithic structure, and
   wherein a second vacuum space is formed at where the outer pad, the stress isolating structure, and the inner pad are arranged, the first vacuum space and the second vacuum space being separated from each other.

2. The stress isolating interposer of claim 1, wherein the outer pad surrounds a periphery of the inner pad.

3. The stress isolating interposer of claim 2, wherein the stress isolating structure comprises a plurality of separate stress isolating structures extending between the outer pad and the inner pad.

4. The stress isolating interposer of claim 2, wherein the stress isolating structure comprises one or more of an auxetic structure, a lattice, and a spring-mass damper structure.

5. A stress isolating sensor package for a microelectromechanical sensor, the stress isolating sensor package comprising:
   a jacket having a vacuum space therein, the jacket extending around and under the microelectromechanical sensor and comprising electrical feedthroughs; and
   an interposer coupled to the jacket, the interposer comprising:
      an outer pad coupled to the jacket;
      an inner pad on which the microelectromechanical sensor is mounted; and
      a stress isolating structure coupling the outer pad and the inner pad to each other, the outer pad, the stress isolating structure, and the inner pad being a monolithic structure,
   wherein the vacuum space in the jacket is isolated from an area at where the interposer is arranged.

6. The stress isolating sensor package of claim 5, further comprising a plurality of supports under the interposer and extending between the jacket and the outer pad of the interposer.

7. The stress isolating sensor package of claim 6, wherein the inner pad and the stress isolating structure are suspended above the jacket without any supports extending there between.

8. The stress isolating sensor package of claim 6, wherein the supports comprise a first group of supports and a second group of supports, the second group of supports being arranged between the first group of supports and the inner pad, and
   wherein a width or diameter of each of the supports of the second group of supports is smaller than a width or diameter of each of the supports of the first group of supports.

9. The stress isolating sensor package of claim 6, further comprising a plurality of additional supports under the stress isolating structure and extending between the jacket and the stress isolating structure.

10. The stress isolating sensor package of claim 6, wherein the stress isolating structure comprises one or more of an auxetic structure comprising a plurality of unit cells, a lattice, and/or a spring-mass damper structure.

11. The stress isolating sensor package of claim 5, wherein the jacket and the interposer are a monolithic structure.

12. The stress isolating sensor package of claim 5, wherein the interposer further comprises electrical traces.

13. The stress isolating sensor package of claim 5, further comprising a heater and a thermal probe on the inner pad.

14. The stress isolating sensor package of claim 5, further comprising a support structure within the vacuum space in the jacket.

15. The stress isolating sensor package of claim 14, wherein the support structure in the jacket comprises one or more of a lattice structure, a truss structure, a three-dimensional re-entrant structure, and a gusset structure.

16. The stress isolating sensor package of claim 14, further comprising a reflective coating on the jacket.

17. A method of additively manufacturing a stress isolating sensor package, the method comprising:
   selectively irradiating a light onto a layer of pre-ceramic resin in a two-dimensional pattern to cure the pre-ceramic resin layer-by-layer into a green-state sensor package, the green-state sensor package comprises a green-state interposer,
   wherein the green-state interposer comprises:
      an inner pad;
      a stress isolating structure around the inner pad; and
      an outer pad around the stress isolating structure.

18. The method of claim 17, wherein the green-state sensor package further comprises:
   a green-state hollow double-walled jacket around the green-state interposer; and
   a plurality of supports within the hollow double-walled jacket.

19. The method of claim 18, wherein the green-state sensor package further comprises a plurality of supports connecting the outer pad of the green-state interposer and the green-state hollow double-walled jacket.

20. The method of claim 18, wherein the light has a wavelength in a range of 200 nm to 500 nm.

21. The method of claim 18, further comprising heat treating the green-state sensor package to form a ceramic package, wherein the heat treating occurs at temperatures in a range from 150° C. to 1,800° C. in an atmosphere of air, argon, nitrogen, hydrogen, oxygen, ammonium, silanes, or a mixture thereof.

22. The method of claim 21, further comprising:
forming an opening in the green-state hollow double-walled jacket before the heat treating;
pulling a vacuum from a space inside the hollow double-walled jacket after the heat treating; and
sealing the opening in the hollow double-walled jacket to form a vacuum space in the hollow double-walled jacket.

23. The method of claim 17, wherein the pre-ceramic resin comprises ceramic particles.

24. The method of claim 17, wherein the stress isolating structure comprises one or more of an auxetic structure, an auxetic lattice structure, a lattice structure, and a spring-mass damper structure.

* * * * *